United States Patent
Chen et al.

(10) Patent No.: US 9,773,800 B1
(45) Date of Patent: Sep. 26, 2017

(54) NON-VOLATILE MEMORY STRUCTURE AND MANUFACTURING METHOD THEREOF

(71) Applicant: UNITED MICROELECTRONICS CORP., Hsin-Chu (TW)

(72) Inventors: Chih-Jung Chen, Hsinchu County (TW); Tzu-Ping Chen, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/250,930

(22) Filed: Aug. 30, 2016

(30) Foreign Application Priority Data

Jul. 21, 2016 (CN) .......................... 2016 1 0576728

(51) Int. Cl.
| | |
|---|---|
| H01L 21/336 | (2006.01) |
| H01L 29/792 | (2006.01) |
| H01L 31/119 | (2006.01) |
| H01L 27/11568 | (2017.01) |
| H01L 29/66 | (2006.01) |
| H01L 29/423 | (2006.01) |
| H01L 21/3213 | (2006.01) |
| H01L 21/28 | (2006.01) |

(52) U.S. Cl.
CPC .. *H01L 27/11568* (2013.01); *H01L 21/28282* (2013.01); *H01L 21/32133* (2013.01); *H01L 29/4234* (2013.01); *H01L 29/66833* (2013.01); *H01L 29/792* (2013.01)

(58) Field of Classification Search
CPC ... H01L 29/4234; H01L 29/66; H01L 29/833; H01L 29/792; H01L 21/823462; H01L 21/823857
USPC ........ 438/258, 287, 288; 257/288, 324, 374, 257/411, 501, 506
See application file for complete search history.

(56) References Cited

U.S. PATENT DOCUMENTS

| | | | |
|---|---|---|---|
| 2003/0008526 A1 | 1/2003 | Gambino | |
| 2007/0218669 A1* | 9/2007 | Li | H01L 21/28273 438/592 |
| 2008/0020568 A1* | 1/2008 | Jang | H01L 21/28518 438/664 |
| 2008/0153222 A1* | 6/2008 | Lee | H01L 29/792 438/257 |
| 2009/0001450 A1* | 1/2009 | Kim | H01L 21/28273 257/324 |
| 2009/0309154 A1* | 12/2009 | Cho | H01L 27/11521 257/324 |

* cited by examiner

*Primary Examiner* — Hsien Ming Lee
(74) *Attorney, Agent, or Firm* — Winston Hsu

(57) ABSTRACT

The present invention provides a non-volatile memory structure, which includes a substrate, a gate dielectric layer disposed on the substrate, two charge trapping layers, disposed on two sides of the gate dielectric layer respectively and disposed on the substrate, a gate conductive layer disposed on the gate dielectric layer and on the charge trapping layers, wherein a sidewall of the gate conductive layer is aligned with a sidewall of one of the two charge trapping layers, and at least one vertical oxide layer, disposed beside the sidewall of the gate conductive layer.

18 Claims, 6 Drawing Sheets

NON-VOLATILE MEMORY STRUCTURE AND MANUFACTURING METHOD THEREOF

BACKGROUND OF THE INVENTION

1. Field of the Invention

The present invention relates to a non-volatile memory structure and a manufacturing method thereof, and more particularly, to a silicon-oxide-nitride-oxide-semiconductor (hereinafter abbreviated as SONOS) non-volatile memory structure and a manufacturing method thereof.

2. Description of the Prior Art

Semiconductor memory devices are prevalently used in computer and electronics industries as a means for retaining digital information. Typically, the semiconductor memory devices are divided into volatile and non-volatile memory devices depending on whether the data stored in the memory devices is completely lost or not in case of power interruption. And the non-volatile memory devices, which can retain their data even when the power supply is interrupted, have been widely employed.

In the conventional non-volatile memory technology, a SONOS memory structure is used to build a silicon nitride layer sandwiched between two silicon oxide layers for serving as the charge trap layer while the two silicon oxide layers respectively serve as a charge tunnel layer and a charge block layer. This oxide-nitride-oxide (ONO) multi-layered structure is further formed between a semiconductor substrate and a silicon floating gate, and thus a SONOS memory structure is constructed.

Since the microprocessors have become more powerful, requirements of memory devices of large-capacity and low-cost are raised. To satisfy such trend and achieve challenge of high integration in semiconductor devices, memory miniaturization is kept on going, and thus fabrication process of memory structure is getting complicated. Furthermore, it is observed that the elements for constructing semiconductor devices are getting more and more susceptible to the process and thus the process control for ensuring yield and performance of the semiconductor devices becomes more and more important. For example, the nitride layer, which serves as the charge trapping layer, plays the essential role for storing data, therefore it is always important to protect the nitride layer in the fabrication process.

SUMMARY OF THE INVENTION

The present invention provides a non-volatile memory structure, which includes a substrate, a gate dielectric layer disposed on the substrate, two charge trapping layers, disposed on two sides of the gate dielectric layer respectively and disposed on the substrate, a gate conductive layer disposed on the gate dielectric layer and on the charge trapping layers, wherein a sidewall of the gate conductive layer is aligned with a sidewall of one of the two charge trapping layers, and at least one vertical oxide layer, disposed beside the sidewall of the gate conductive layer.

The present invention further provides a method for manufacturing a non-volatile memory structure, which includes the steps: firstly, a substrate is provided, a gate dielectric layer is formed on the substrate, a gate conductive layer is then formed on the gate dielectric layer, next, a first etching process is performed, to remove parts of the gate dielectric layer, and to form at least one recess under the gate conductive layer, afterwards, a multiple layer structure is formed to fill in the at least one recess, to cover the substrate, and to cover two sidewalls and a top surface of the gate conductive layer, and an oxidation process is performed, to transfer parts of the multiple layer structure into at least one oxide layer.

Accordingly, the method for manufacturing the non-volatile memory structure provided by the present invention is easily integrated to the state-of-the-art logic fabrication processes. More important, by forming the oxide layer to cover the ONO structure, particularly to cover the first nitride layer of the ONO structure, the first nitride layer is protected from damages generated in the following processes. And thus the charge trapping function of the first nitride layer is ensured.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 illustrate a forming method of a non-volatile memory structure according to a first embodiment of the present invention, wherein:

FIG. 1 shows the schematic diagram of the non-volatile memory, including a first gate structure formed on a substrate;

FIG. 2 shows the schematic diagram of the non-volatile memory after two recesses and a first silicon oxide layer are formed;

FIG. 3 shows the schematic diagram of the non-volatile memory after a first silicon nitride layer is formed;

FIG. 4 shows the schematic diagram of the non-volatile memory after a first oxidation process is performed;

FIG. 5 shows the schematic diagram of the non-volatile memory after a first etching back process is performed;

FIG. 6 shows the schematic diagram of the non-volatile memory after a second silicon oxide layer is formed;

FIG. 7 shows the schematic diagram of the non-volatile memory after a second etching back process is performed.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
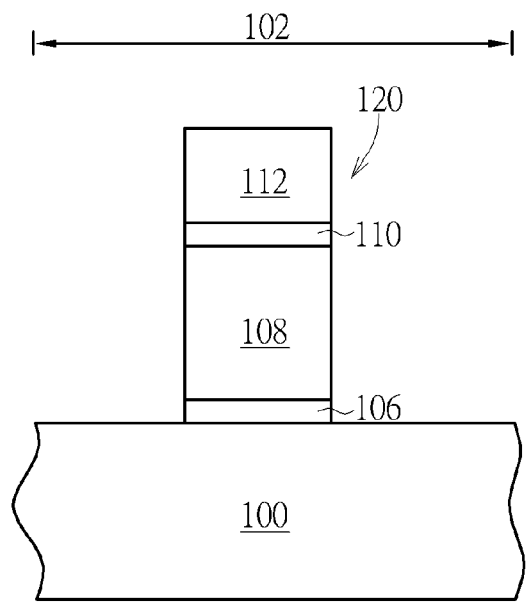

Please refer to FIGS. 1-7, which are drawings illustrating a method for manufacturing a non-volatile memory structure provided by a preferred embodiment of the present invention. As shown in FIG. 1, a substrate 100 is first provided. The substrate 100 can be a silicon substrate, but not limited to this. The substrate 100 includes a memory region 102. A dielectric layer 106 and a conductive layer 108 are sequentially formed on a surface of the substrate 100. In the preferred embodiment, the dielectric layer 106 is a silicon oxide layer formed by methods such as thermal oxidation or deposition, and the conductive layer is a polysilicon layer, but not limited to this. Additionally, p-wells and/or n-wells (not shown) required by different semiconductor devices can be formed in the substrate 100 in advance.

Please still refer to FIG. 1. Next, a masking layer 110 and a photoresist layer 112 are sequentially formed on the substrate 100. It is noteworthy that the photoresist layer 112 is patterned to define a gate in the memory region 102. Subsequently, an etching process is performed to etch the masking layer 110, the conductive layer 108 and the dielectric layer 106 exposed by the patterned photoresist layer 112 to form at least a first gate structure 120 in the memory region 102. As shown in FIG. 1, the first gate structure 120 includes at least the conductive layer 108 and the dielectric layer 106.

Figure 2:
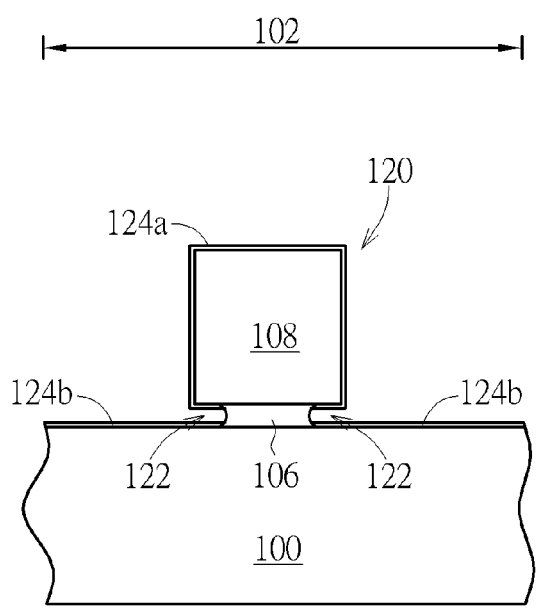

Please refer to FIG. 2, after the photoresist layer 112 and the masking layer 110 within the memory region 102 are removed, the dielectric layer 106 of the first gate structure 120 is etched, to form at least one recess (cavity) 122 in the dielectric layer 106. Afterwards, a first silicon oxide layer 124a/124b is formed on the substrate 100. It is noteworthy that because the conductive layer 108 and the substrate 100 include silicon material in the preferred embodiment, it is more preferable that the first silicon oxide layer 124a/124b is formed by a thermal oxidation. Accordingly, the first silicon oxide layer 124a/124b is formed on any exposed silicon material. As shown in FIG. 2, the first silicon oxide layer 124a is therefore formed on top, sidewalls and portions of bottom of the conductive layer 108 of the first gate structure 120, and the first silicon oxide layer 124b is formed on portions of the substrate 100.

Figure 3:
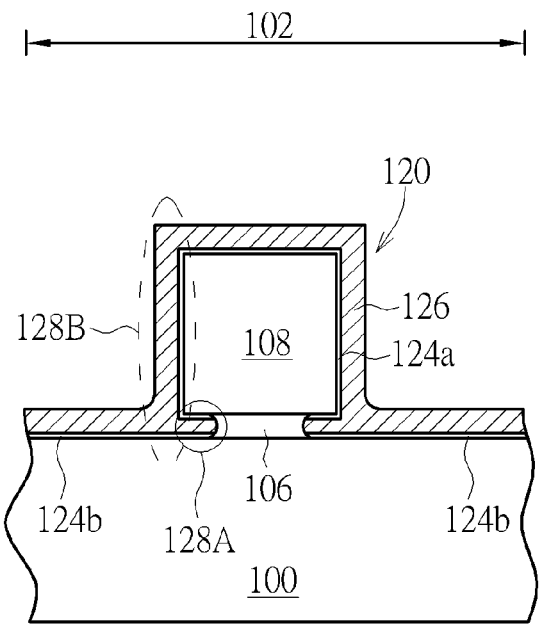
Figure 3A:
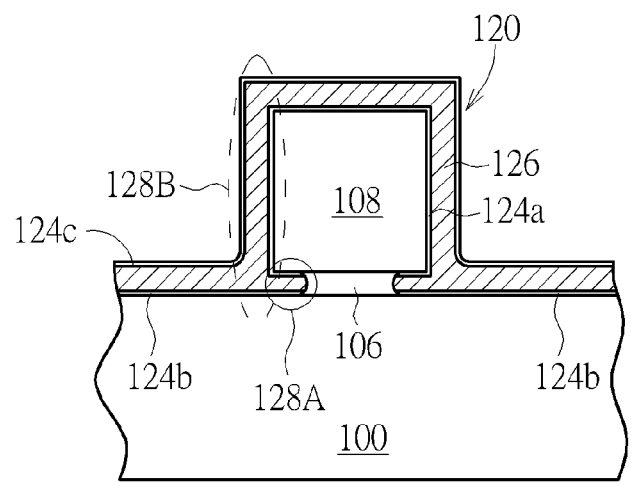
FIG. 3A shows the schematic diagram of the non-volatile memory according to another embodiment of the present invention.

Please refer to FIG. 3. After forming the first silicon oxide layer 124a/124b, a first silicon nitride layer 126 is formed on the substrate 100. It should be noted that the cavities 122 are filled with the first nitride layer 126 as shown in FIG. 3. Next, a stacked structure including a silicon oxide layer-a silicon nitride layer-and a silicon oxide layer arranged in the horizontal direction (hereinafter abbreviated as a horizontal ONO structure) 128A is formed. The horizontal ONO structure 128A includes the first silicon oxide layer 124a formed under the conductive layer 108 of the first gate structure 120, the first silicon oxide layer 124b formed on the substrate 100 under the first gate structure 120, and the first silicon nitride layer 126 disposed between the two first silicon oxide layers 124a/124b. In addition, a silicon oxide layer and a silicon nitride layer stacked structure (two layers stacked structure, hereinafter abbreviated as a vertical stacked structure 128B) is formed on the sidewall of the first gate structure 120. In another embodiment of the present invention, as shown in FIG. 3A, after the first silicon nitride layer 126 is formed, another silicon oxide layer 124c can be formed, and entirely covers the first silicon nitride layer 126. Therefore, the vertical stacked structure 128B disposed on the sidewall of the first gate structure 120 may include three layers: a silicon oxide layer, a silicon nitride layer, and a silicon oxide layer (an ONO structure).

Figure 4:
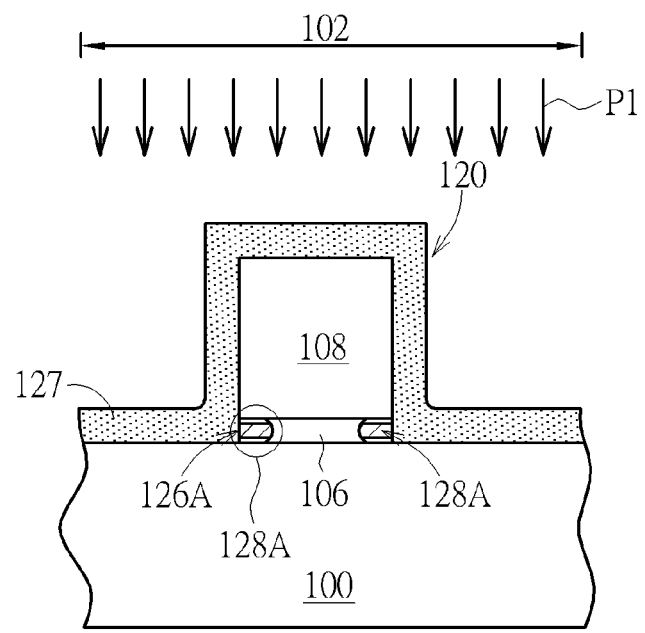
Figure 5:
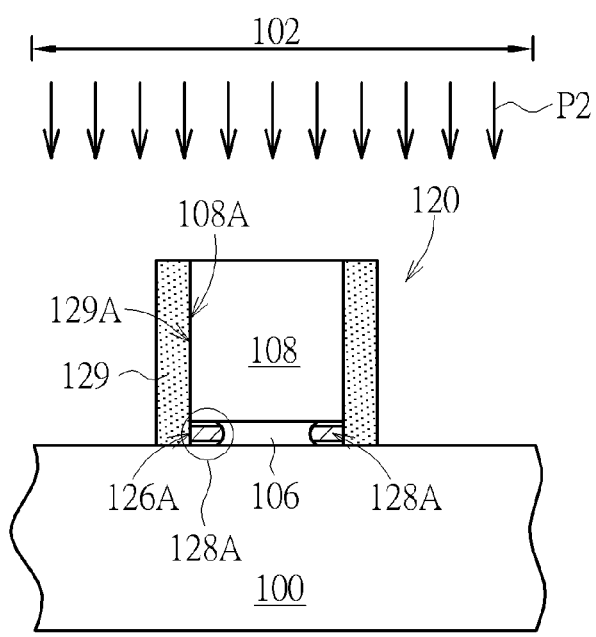

Next, as shown in FIG. 4, an oxidation process P1 is performed, such as a heating process with temperature higher than 900° C. in oxygen environment. During the oxidation process P1, an oxide layer 127 is formed. More precisely, the vertical stacked structure 128B disposed on the sidewall and the top of the first gate structure 120 is oxidized. In other words, the silicon nitride layer 126 of the vertical stacked structure 128B is transferred into a nitrogen containing silicon oxide layer, such as a silicon oxynitride (SiON) layer. Afterwards, as shown in FIG. 5, an etching back process P2 is performed, to remove parts of the oxide layer 127 mentioned above, and the remaining oxide layer is defined as a vertical oxide layer 129 having single layer structure. The vertical oxide layer 129 has a sidewall 129A, the first silicon nitride layer 126 (used as a charge trapping layer) has a sidewall 126A, and the conductive layer 108 has a sidewall 108A. In the present invention, the sidewall 129A, the sidewall 126A and the sidewall 108A are aligned with each other. Besides, the vertical oxide layer 129 does not cover the top of the conductive layer 108. On the other hand, since the horizontal ONO structure 128A is disposed in the recess 122, it is protected by the vertical stacked structure 128B. In the present invention, by adjusting some parameters such as time and temperature of the oxidation process P1, this makes only the vertical stacked structure 128B oxidized and forms the vertical oxide layer 129. But the horizontal ONO structure 128A still contains the structure including the silicon oxide layer-the silicon nitride layer-and the silicon oxide layer (ONO) after the oxidation process P1 is performed. The horizontal ONO structure 128A is disposed on the substrate 100, and it can be covered by the conductive layer 108 (used as a control gate), until this step, a SONOS memory structure is completed.

Figure 6:
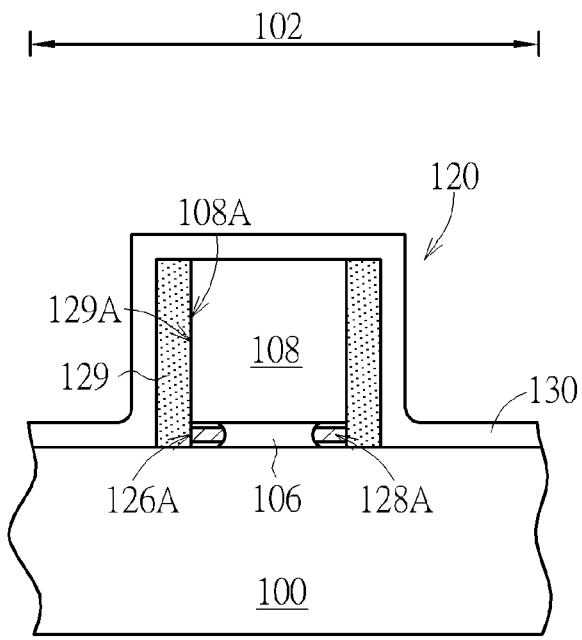
Figure 7:
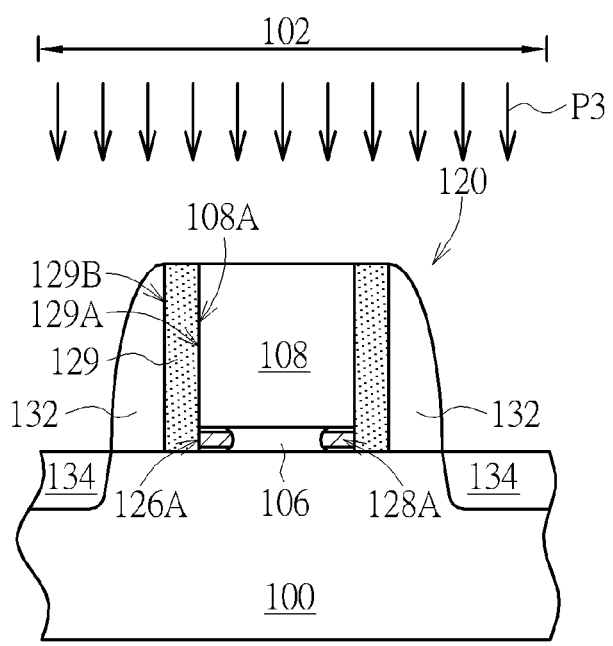

Please refer to FIGS. 6-7. After forming the horizontal ONO structure 128A and the vertical oxide layer 129, a second silicon oxide layer 130, for example but not limited to a tetra-ethyl-ortho-silicate (TEOS) layer, is formed on the substrate 100. According to the preferred embodiment, a thickness of the second silicon oxide layer 130 is between 100 angstroms (Å) and 1000 Å, but not limited to this. Next, another etching back process P3 is performed to remove portions of the second silicon oxide layer 130, and thus a spacer 132 is formed on the sidewalls of the first gate structure 120 to cover the vertical oxide layer 129. It should be noted that a thickness of the spacer 132, which is formed by performing the etching back process, is between 50 Å and 600 Å. Please refer to FIG. 7. After forming the spacer 132, an ion implantation is performed to form source/drain regions 134 in the substrate 100 at two respective sides of the first gate structure 120.

The key feature of the first preferred embodiment mentioned above is that, the horizontal ONO structure 128A is only disposed under the conductive layer 108, it does not extend to the sidewall of the first gate structure 120. In other words, the vertical oxide layer 129 disposed on the sidewall of the first gate structure 120 is a single layer structure. In this way, the durability of the SONOS memory can be improved. More precisely, in another embodiment of the present invention, if the oxidation process P1 is skipped, and an etching process is performed after forming the first silicon nitride layer 126, the ONO structure 128 will extend from the recess 122 to the sidewall of the first gate structure 120. When viewed in a cross section view, the ONO structure 128 has an L-shaped profile (it can be refer to FIG. 7A, which shows a non-volatile memory structure according to another embodiment of the present invention). In other words, each charge trapping layer (the silicon nitride layer of the ONO structure) also has an L-shaped profile. In this structure, the stored charges are distributed in the L-shaped silicon nitride layer. However, since the vertical portion of the L-shaped silicon nitride layer is relative far from the channel regions of the memory, during the erasing operation (removing the charges stored in the charge trapping layer), the charges may not be removed clearly. In order to remove the charges clearly, the operation voltage may be increased, but it also damages the memory device too.

Figure 7A:
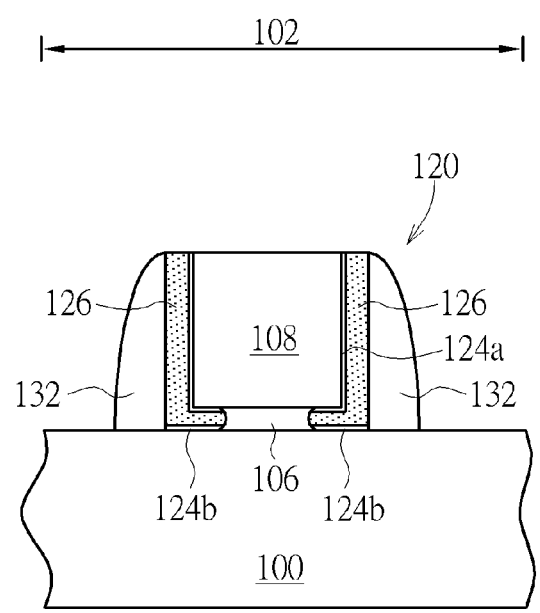
FIG. 7A shows a non-volatile memory structure according to another embodiment of the present invention.
Figure 8:
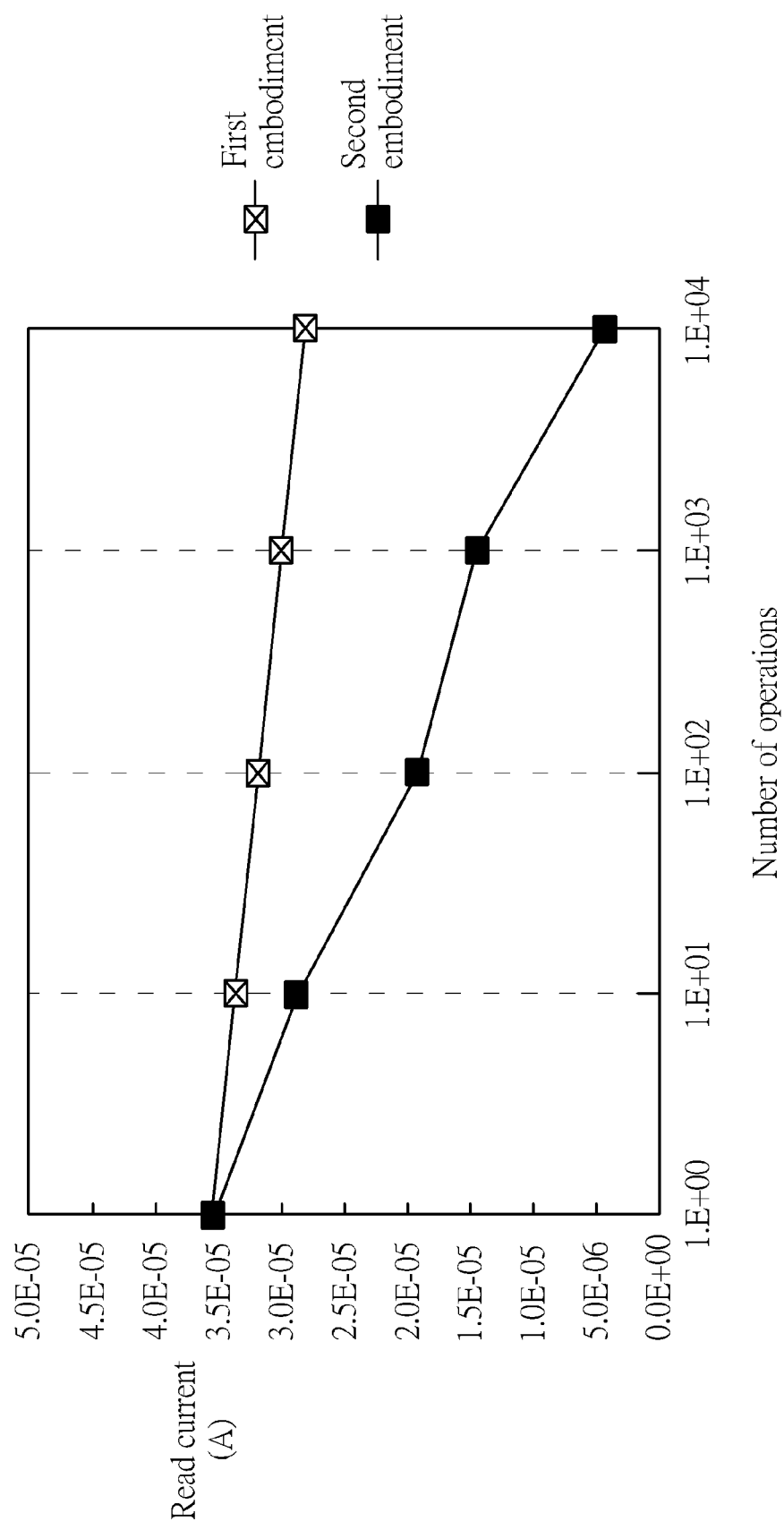
FIG. 8 is a comparison chart showing the durability of the memory devices according to the first preferred embodiment and the second preferred embodiment.

FIG. 8 is a comparison chart showing the durability of the memory devices according to the first preferred embodiment and the second preferred embodiment mentioned above. The durability experiment includes performing writing, reading and erasing operations repeated several times on the memory device of the first preferred embodiment (as shown in FIG. 7) and on the memory device of the second preferred embodiment (as shown in FIG. 7A) respectively. As shown in FIG. 8, it found that the read voltage of the memory device of the second preferred embodiment is decreased significantly after 1000 times operations (only about half of the original voltage), but the read voltage of the memory device of the first preferred embodiment is decreased less. In other words, the memory device of the first preferred embodiment has better durability.

Accordingly, the method for manufacturing the non-volatile memory structure provided by the present invention is easily integrated to the state-of-the-art logic fabrication processes. More important, by forming the spacer 132 to cover the vertical oxide layer 129, the first nitride layer 126 is protected from damages generated in the following processes. And thus the charge trapping function of the first nitride layer 126 is ensured.

Accordingly, the method for manufacturing the non-volatile memory structure provided by the present invention is easily integrated to the state-of-the-art logic fabrication processes without rendering any impact. More important, by forming the oxide layer to cover the ONO structure, particularly to cover the nitride layer of the ONO structure, the nitride layer is protected from damages. And thus the charge trapping function of the nitride layer is ensured. Accordingly, electrical performance of the non-volatile memory structure provided by the present invention is ensured.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory structure, comprising:
a substrate;
a gate dielectric layer disposed on the substrate;
two charge trapping layers, disposed on two sides of the gate dielectric layer respectively and disposed on the substrate;
a gate conductive layer disposed on the gate dielectric layer and on the charge trapping layers, wherein a sidewall of the gate conductive layer is aligned with a sidewall of one of the two charge trapping layers;
at least one vertical oxide layer, disposed beside the sidewall of the gate conductive layer, wherein the vertical oxide layer directly contacts the substrate; and
at least one spacer disposed on an outer sidewall of the vertical oxide layer.

2. The non-volatile memory structure of claim 1, wherein the vertical oxide layer is a single layer structure.

3. The non-volatile memory structure of claim 1, wherein a sidewall of the vertical oxide layer, a sidewall of the charge trapping layer and a sidewall of the gate conductive layer are aligned with each other.

4. The non-volatile memory structure of claim 1, wherein the spacer directly contacts the vertical oxide layer and the substrate.

5. The non-volatile memory structure of claim 1, wherein the vertical oxide layer does not cover a top surface of the gate conductive layer.

6. The non-volatile memory structure of claim 1, further comprising at least two silicon oxide layers, each charge trapping layer is disposed between the two silicon oxide layers.

7. The non-volatile memory structure of claim 6, wherein the two silicon oxide layers and the charge trapping layer compose a silicon oxide-silicon nitride-silicon oxide (ONO) stacked structure.

8. The non-volatile memory structure of claim 1, wherein the vertical oxide layer is a nitrogen containing silicon oxide layer.

9. A method for forming a non-volatile memory structure, comprising the following steps:
providing a substrate;
forming a gate dielectric layer on the substrate;
forming a gate conductive layer on the gate dielectric layer;
performing a first etching process, to remove parts of the gate dielectric layer, and to form at least one recess under the gate conductive layer;
forming a multiple layer structure filled in the at least one recess, to cover the substrate, and to cover two sidewalls and a top surface of the gate conductive layer; and
performing an oxidation process, to transfer parts of the multiple layer structure into at least one oxide layer, wherein the oxide layer directly contacts the substrate.

10. The method of claim 9, further comprising performing a second etching process after the oxidation process is performed, to remove parts of the oxide layer, and to form at least one vertical oxide layer.

11. The method of claim 10, further comprising forming at least one spacer on an outer sidewall of the vertical oxide layer.

12. The method of claim 11, wherein the spacer directly contacts the vertical oxide layer and the substrate.

13. The method of claim 10, wherein the vertical oxide layer does not cover a top surface of the gate conductive layer.

14. The method of claim 10, wherein the vertical oxide layer is a nitrogen containing silicon oxide layer.

15. The method of claim 9, wherein after the oxidation process is performed, the multiple layer structure disposed in the recess comprises at least one charge trapping layer.

16. The method of claim 15, wherein the at least one charge trapping layer is not transferred into the oxide layer by the oxidation process.

17. The method of claim 15, wherein the at least one charge trapping layer is disposed on one side of the gate dielectric layer and disposed on the substrate, the gate conductive layer is disposed on the gate dielectric layer and disposed on the charge trapping layer, and wherein a sidewall of the gate conductive layer is aligned with a sidewall of the charge trapping layer.

18. The method of claim 15, further comprising forming silicon oxide layers disposed on and disposed under the charge trapping layer respectively, and the multiple layer structure comprises the two silicon oxide layers and the charge trapping layer.

* * * * *